United States Patent
Liu-Shen

(10) Patent No.: US 9,037,878 B2
(45) Date of Patent: May 19, 2015

(54) SERVER RACK SYSTEM

(75) Inventor: Hsien Liu-Shen, Taipei (TW)

(73) Assignee: INVENTEC CORPORATION, Taipei (TW)

(*) Notice: Subject to any disclaimer, the term of this patent is extended or adjusted under 35 U.S.C. 154(b) by 580 days.

(21) Appl. No.: 13/401,311

(22) Filed: Feb. 21, 2012

(65) Prior Publication Data

US 2013/0138988 A1 May 30, 2013

(30) Foreign Application Priority Data

Nov. 28, 2011 (CN) .......................... 2011 1 0385720

(51) Int. Cl.
G06F 1/26 (2006.01)
G06F 1/28 (2006.01)
G06F 1/18 (2006.01)
G06F 1/30 (2006.01)
H05K 7/14 (2006.01)

(52) U.S. Cl.
CPC *G06F 1/28* (2013.01); *G06F 1/189* (2013.01); *G06F 1/30* (2013.01); *H05K 7/1492* (2013.01)

(58) Field of Classification Search
CPC ..................................................... G06F 1/3203
USPC ....................................................... 713/300
See application file for complete search history.

(56) References Cited

U.S. PATENT DOCUMENTS

| | | | | |
|---|---|---|---|---|
| 5,483,656 | A * | 1/1996 | Oprescu et al. | 713/320 |
| 7,051,215 | B2 * | 5/2006 | Zimmer et al. | 713/300 |
| 7,761,622 | B2 * | 7/2010 | Nguyen | 710/62 |
| 8,250,382 | B2 * | 8/2012 | Maglione et al. | 713/300 |

* cited by examiner

*Primary Examiner* — Kim Huynh
*Assistant Examiner* — Eric Chang
(74) *Attorney, Agent, or Firm* — CKC Partners & Co., Ltd.

(57) ABSTRACT

A server rack system includes a rack, a rack management module, a plurality of servers, a management network connection module and a power module. The rack management module is located in the rack and coupled to a management network line. The servers are located in the rack and respectively have a baseboard management controller (BMC), in which each of the BMCs is used for monitoring a working state of the server where the BMC resides. The power module provides a working voltage required by the rack management module, the management network connection module and the servers. The rack management module obtains overall power consumption information through the power module, and obtains power consumption information of each of the servers through the management network line, and is used for managing the servers according to the overall power consumption information and the power consumption information of each of the servers.

11 Claims, 1 Drawing Sheet

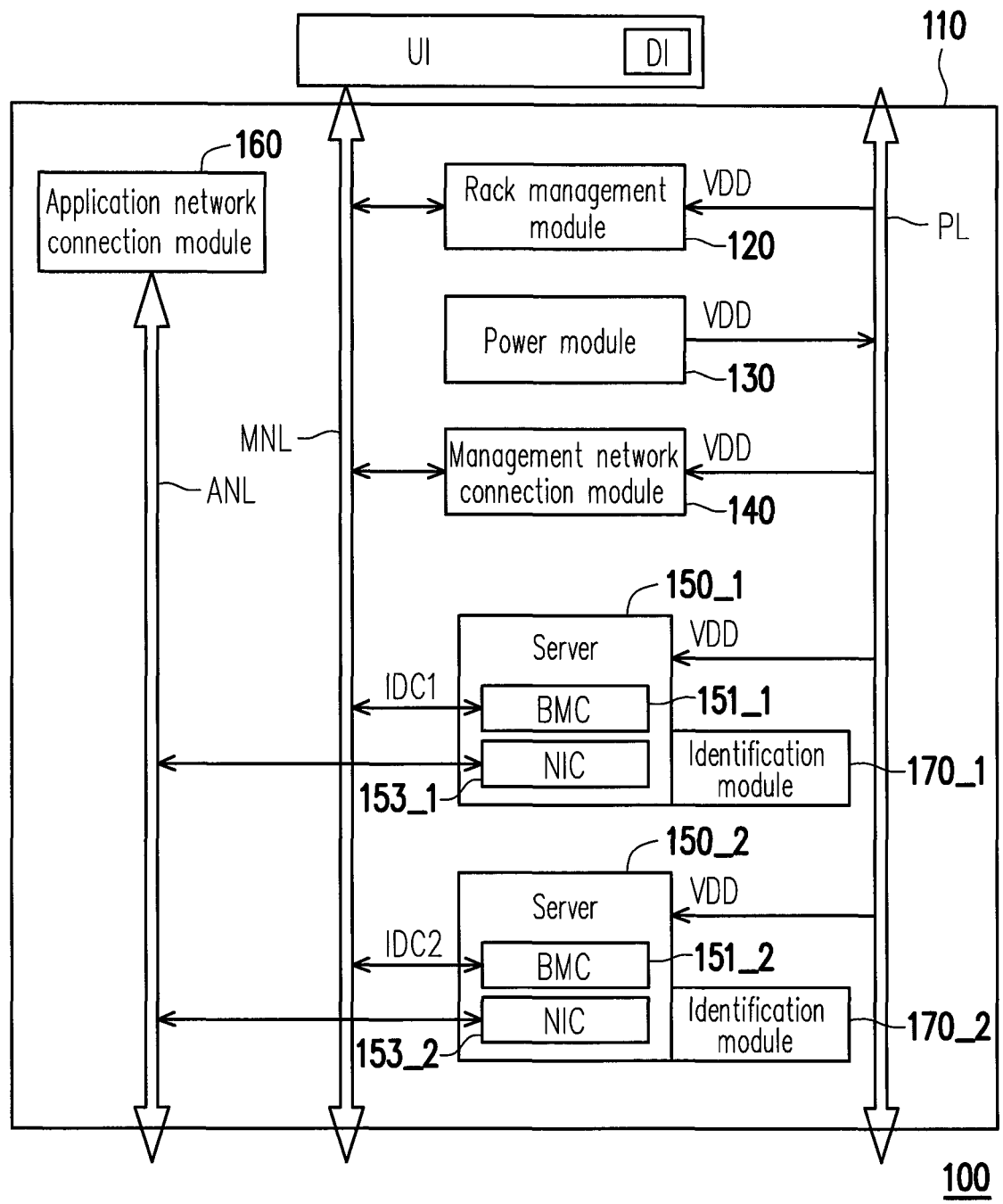

SERVER RACK SYSTEM

CROSS-REFERENCE TO RELATED APPLICATION

This application claims the priority benefit of China application serial no. 201110385720.0, filed Nov. 28, 2011. The entirety of the above-mentioned patent application is hereby incorporated by reference herein and made a part of this specification.

BACKGROUND OF THE INVENTION

1. Field of the Invention

The present invention generally relates to a server system, in particular, to a server rack system.

2. Description of Related Art

In recent years, computer servers have gradually developed from conventional single servers to rack servers with a plurality of servers put in a rack. Many servers exist in a rack server, and a server host usually needs to operate for a long time. Therefore, a stable power supply is very importance. Either overload or shortage of a host power source may damage data of the server host, thereby causing a great loss. In addition, as the server host operates for a long time, power consumption is also great. From the perspective of saving cost, how to monitor the power consumption of each host and provide optimized power consumption control remains to be further considered in application of the rack server system.

SUMMARY OF THE INVENTION

Accordingly, the present invention is directed to a server rack system, in which a rack management module performs optimal power consumption control on each server and dynamically monitors real-time power consumption of each server according to overall power consumption information and power consumption information of each server obtained from a power module and each baseboard management controller (BMC).

The present invention provides a server rack system, including a rack, a rack management module, a plurality of servers, a management network connection module and a power module. The rack management module is located in the rack and coupled to a management network line. The servers are located in the rack, and each of the servers respectively has a BMC, in which each BMC is used for monitoring a working state of the server where the BMC resides. The power module is electrically connected to the rack management module, the management network connection module and the plurality of servers, and is used for providing a working voltage required by the rack management module, the management network connection module and the plurality of servers, and the power module is controlled by the rack management module. The rack management module obtains overall power consumption information of the server rack system through the power module, and obtains power consumption information of each of the servers from each of the BMCs through the management network line. The rack management module manages each of the servers through each of the BMCs according to the overall power consumption information and the power consumption information of the servers.

In an embodiment of the present invention, the server rack system further includes an application network connection module. The application network connection module is located in the rack, coupled to an application network line, and coupled to network interfaces of the servers respectively through the application network line, in which the servers provide application services through the application network line.

In an embodiment of the present invention, the management network line and/or the application network line is an Ethernet line.

In an embodiment of the present invention, the server rack system further includes at least one identification module. The identification module is located in the rack and corresponding to each of the servers, and when any one of the servers is inserted in the rack and produces a corresponding relation with a corresponding identification module, the server generates an identification code signal. The BMC of the server obtains the identification code signal, and sends the identification code signal to the rack management module through the management network line. A corresponding relation record between physical locations in the rack and identification codes is stored in the rack management module beforehand, and after receiving the identification code signal, the rack management module identifies a physical location of the server in the rack according to the corresponding relation record.

In an embodiment of the present invention, the identification code signal has at least one flag bit for representing a physical location of the server rack system in a machine room.

In an embodiment of the present invention, the rack management module provides a user interface through the management network line, and the user interface provides a display interface for enabling an administrator to read power consumption of the server at each physical location in the rack through the display interface.

In an embodiment of the present invention, the rack management module provides a user interface through the management network line, so as to set a power consumption control rule of the server rack system in the rack management module through the user interface.

In an embodiment of the present invention, the power consumption control rule includes setting a power consumption upper limit of the server rack system.

In an embodiment of the present invention, the rack management module reads real-time power consumption of internal rack devices other than the servers at a time point, and computes optimal power consumption of the servers at the time point according to the power consumption upper limit, and the rack management module controls real-time power consumption of each of the servers at the time point according to the optimal power consumption.

In an embodiment of the present invention, the power consumption control rule includes, when the rack management module determines that at least one server is in a critical state according to the power consumption information of the servers, sending a management instruction to the server to control the server to stop increasing power consumption thereof and/or forbid startup of a server in a standby state.

In an embodiment of the present invention, the power consumption control rule includes, when the rack management module determines that at least one server is in a non-recoverable state according to the power consumption information of the servers, controlling the server to shut down forcibly.

In an embodiment of the present invention, the rack management module is an intelligent platform management interface (IPMI).

Based on the above, in the server rack system according to the embodiment of the present invention, the rack management module dynamically obtains the overall power consumption and the power consumption of each of the servers through the power module and the BMC, so as to dynamically monitor and manage the working state of each of the servers according to the overall power consumption information and the power consumption information of each of the servers.

In order to make the aforementioned features and advantages of the present invention comprehensible, embodiments are described in detail below with reference to the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a schematic system diagram of a server rack system according to an embodiment of the present invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic system diagram of a server rack system according to an embodiment of the present invention. Referring to FIG. 1, in this embodiment, a server rack system 100 includes a rack 110, a rack management module 120, a power module 130, a management network connection module 140, a plurality of servers (such as 150_1 and 150_2), an application network connection module 160 and a plurality of identification modules (such as 170_1 and 170_2), in which the rack management module 120 is, for example, an IPMI.

In this embodiment, the rack management module 120 is located in the rack 110 and coupled to a management network line MNL. The servers (such as 150_1 and 150_2) are located in the rack 110, and the servers (such as 150_1 and 150_2) respectively have BMCs (such as 151_1 and 151_2) and network interface controllers (NICs) (such as 153_1 and 153_2). The BMCs (such as 151_1 and 151_2) are used for monitoring a working state of the servers (such as 150_1 and 150_2) where the BMCs reside, that is, the BMC 151_1 is used for monitoring the working state of the server 150_1, the BMC 151_2 is used for monitoring the working state of the server 150_2, and so on.

The management network connection module 140 is located in the rack 110 and coupled to the management network line MNL, and is used for monitoring messages on the management network line MNL. In addition, the management network connection module 140 connects the rack management module 120 and the BMCs (such as 151_1 and 151_2) on the servers (such as 150_1 and 150_2) through the management network line MNL, namely, transfers messages of the rack management module 120 to the BMCs (such as 151_1 and 151_2) and transfers messages of the BMCs (such as 151_1 and 151_2) to the rack management module 120.

The power module 130 is electrically connected to the rack management module 120, the management network connection module 140 and the servers (such as 150_1 and 150_2) through a power line PL, and is used for providing a working voltage VDD required by the rack management module 120, the management network connection module 140 and the servers (such as 150_1 and 150_2). In this embodiment, the power module 130 is controlled by the rack management module 120. The rack management module 120 obtains overall power consumption information of the server rack system 100 through the power module 130, and obtains power consumption information of the servers (such as 150_1 and 150_2) from the BMCs (such as 151_1 and 151_2) through the management network line MNL. The rack management module 120 may be connected to the power module 130 through the management network line MNL or the power line PL, and the embodiment of the present invention is not limited thereto.

The rack management module 120 manages the servers (such as 150_1 and 150_2) through the BMCs (such as 151_1 and 151_2) according to the overall power consumption information and the power consumption information of the servers (such as 150_1 and 150_2). The rack management module 120 delivers a corresponding management instruction to the servers (such as 150_1 and 150_2) according to a power consumption control rule, so as to achieve optimized control of power consumption of the servers (such as 150_1 and 150_2) and overall power consumption, prevent overload of the servers and maintain stable operation of the servers.

In this embodiment, the power consumption control rule of the server rack system 100 may perform corresponding control for different operation states, for example, the situation where the overall power consumption of the server rack system 100 reaches an upper limit, the server in a critical state and the server in a non-recoverable state. In the power consumption control rule of the server rack system 100, a power consumption upper limit of the server rack system 100 is set first, in which the power consumption upper limit may be computed by the rack management module 110 according to rated power of the power module 130 or set by the system administrator, and the embodiment of the present invention is not limited thereto.

When the overall power consumption information of the server rack system 100 reaches the power consumption upper limit, the rack management module 110 may control elements (such as servers 150_1 to 150_2) in the server rack system 100 to reduce the overall power consumption. For example, when the overall power consumption information exceeds the power consumption upper limit of the power consumption control rule, the rack management module 120 transfers the management instruction to the servers (such as 150_1 and 150_2), so that the BMCs (such as 151_1 and 151_2) reduce a working speed of the servers (such as 150_1 and 150_2) according to the management instruction, so as to reduce the overall power consumption.

In addition, when the rack management module 120 determines that at least one server is in the critical state according to the power consumption information of the servers, the rack management module 120 may send the corresponding management instruction to the servers according to the power consumption control rule, so as to control the server in the critical state to stop increasing the power consumption and meanwhile forbid startup of a server in a standby state. However, in other embodiments, the rack management module 120 may control the server in the critical state to stop increasing the power consumption or forbid startup of the server in the standby state. For example, if the rack management module 120 determines that the server 150_1 is in the critical state, the rack management module 120 sends the management instruction to the BMC 151_1, so as to enable the server 150_1 to perform the corresponding operation, for example, adjust the working speed of the server 150_1 to reduce the power consumption thereof. In addition, the rack management module 120 may send the management instruction to the server (such as 150_2) in the standby state, so as to forbid startup of the server (such as 150_2) in the standby state. Based on the above, if more than one server in the server rack system 100 is in the critical state, the rack management module 120 sends a plurality of management instructions to the servers in the critical state to control the servers to stop increasing the power consumption.

When determining that at least one server is in the non-recoverable state, the rack management module 120 controls the server in the non-recoverable state to shut down forcibly. For example, if the rack management module 120 determines that the server 150_2 is in the non-recoverable state, the rack management module 120 sends a management instruction to the BMC 151_2 to control the server 150_2 to shut down forcibly, so as to avoid unnecessary power consumption as power is continuously supplied to the server 150_2 that cannot operate normally. Based on the above, if more than one server in the server rack system 100 is in the non-recoverable state, the rack management module 120 sends a plurality of management instructions to the servers in the non-recoverable state to control the servers to shut down forcibly.

In addition, the rack management module 120 may read real-time power consumption of internal rack devices (such as the power module 130, the management network connection module 140 or the application network connection module 160) other than the servers (such as 150_1 and 150_2) at a time point, and compute optimal power consumption of the servers (such as 150_1 and 150_2) at the time point according to the power consumption upper limit of the power consumption control rule. The rack management module 120 controls real-time power consumption of the servers (such as 150_1 and 150_2) at the time point according to the computed optimal power consumption. In this embodiment, the manner for computing optimal power consumption may be expressed by the following formula:

$$SSPC=PCL-OPC$$

SSPC denotes the optimal power consumption of the server, PCL denotes the power consumption upper limit, OPC denotes total power consumption of other devices (such as the power module 130, the management network connection module 140 or the application network connection module 160) in the server rack system 100. Based on the above, the rack management module 120 may perform optimized control of the real-time power consumption on the servers (such as 150_1 and 150_2) according to the power consumption upper limit, so that the server rack system 100 has the lowest power consumption.

Since other loads than the servers in the server rack system 100 may change as time passes by, the server rack system 100 may detect the total power consumption of other devices than the servers at different time points, compute the optimal power consumption of the servers according to the detected total power consumption and the power consumption upper limit, and achieve dynamic power consumption control in this manner. The above manner for setting the power consumption control rule and the power consumption control manner are merely provided for clearer description of this embodiment, and other embodiments of the present invention are not limited thereto.

The rack management module 120 provides a user interface UI to a local controller (not shown) or a remote controller (not shown) through the management network line MNL, in which the user interface UI provides a display interface DI for displaying related information of the servers (such as 150_1 and 150_2) on a display device (not shown). In addition, the local controller (not shown) or the remote controller (not shown) may set the power consumption control rule of the server rack system 100 in the rack management module 120 and manage the servers (such as 150_1 and 150_2) in the rack 110 through the user interface UI, and may read the power consumption of the servers (such as 150_1 and 150_2) in the rack 110 through the display interface DI.

The application network connection module 160 is located in the rack 110 and coupled to an application network line ANL, and coupled to the NICs (such as 153_1 and 153_2) of the servers (such as 150_1 and 150_2) respectively through the application network line ANL, namely, coupled to network interfaces of the servers (such as 150_1 and 150_2), in which the servers (such as 150_1 and 150_2) provide application services through the application network line ANL. In this embodiment, the management network line MNL and the application network line ANL may be Ethernet lines, but the present invention is not limited thereto.

The identification modules (such as 170_1 and 170_2) are located in the rack 110 and corresponding to the servers (such as 150_1 and 150_2), for example, the identification module 170_1 corresponds to the server 150_1, and the identification module 170_2 corresponds to the application server 150_2. The number of the identification modules may be less than or equal to the number of servers that can be inserted in the rack 110, that is, when a corresponding relation between the identification modules and the servers is that one identification module corresponds to all servers, the number of the identification module is 1; when the corresponding relation between the identification modules and the servers is that two identification modules correspond to all servers, the number of the identification modules is 2, and so on.

When the servers (such as 150_1 and 150_2) are inserted in the rack 110 and produce a corresponding relation (for example, electrical connection or mechanical connection) with the corresponding identification modules (such as 170_1 and 170_2), the servers (such as 150_1 and 150_2) generate identification code signals (such as IDC1 and IDC2). Upon obtaining the identification code signals (such as IDC1 and IDC2), the BMCs (such as 151_1 and 151_2) of the servers (such as 150_1 and 150_2) send the identification code signals (such as IDC1 and IDC2) to the rack management module 120 through the management network line MNL, and the rack management module 120 identifies physical locations of the servers (such as 150_1 and 150_2) in the rack 110 according to the identification code signals (such as IDC1 and IDC2). A corresponding relation record between a plurality of physical locations of the rack 110 and the identification code signals (such as IDC1 and IDC2) may be stored in the rack management module 120 beforehand, so as to identify the physical locations of the servers (such as 150_1 and 150_2) in the rack 110 through the identification code signals (such as IDC1 and IDC2).

Based on the above, in the server rack system according to the embodiment of the present invention, the rack management module dynamically obtains the overall power consumption and the power consumption of each of the servers through the power module and the BMC, so as to dynamically monitor and manage the working state of each of the servers according to the overall power consumption information and the power consumption information of each of the servers. In addition, through the power consumption control rule, the server rack system is capable of performing optimized power consumption control according to the power consumption situation and the state of each of the servers. Furthermore, when the server produces the corresponding relation with the identification module, the server generates the identification code signal corresponding to the physical location thereof. The system administrator can control the server at each physical location or read all items of information on the server through the user interface and the display interface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A server rack system, comprising:
   a rack;
   a rack management module, located in the rack and coupled to a management network line;
   a plurality of servers, located in the rack, wherein each of the servers respectively has a baseboard management controller (BMC), and each of the BMCs is used for monitoring a working state of the server where the BMC resides;
   a management network connection module, located in the rack and coupled to the management network line, and used for connecting the rack management module and the BMCs through the management network line;
   a power module, electrically connected to the rack management module, the management network connection module and the servers, used for providing a working voltage required by the rack management module, the management network connection module and the servers, and controlled by the rack management module; and
   at least one identification module, located in the rack and corresponding to each of the servers, wherein
   the rack management module obtains overall power consumption information of the server rack system through the power module, and obtains power consumption information of each of the servers from each of the BMCs through the management network line;
   the rack management module manages each of the servers through each of the BMCs according to the overall power consumption information and the power consumption information of each of the servers;
   when any one of the servers is inserted in the rack and produces a corresponding relation with any one of the identification modules, the server generates an identification code signal; the BMC of the server obtains the identification code signal, and sends the identification code signal to the rack management module through the management network line; a corresponding relation record between physical locations in the rack and identification codes is stored in the rack management module beforehand, and after receiving the identification code signal, the rack management module identifies a physical location of the server in the rack according to the corresponding relation record.

2. The server rack system according to claim 1, further comprising:
   an application network connection module, located in the rack and coupled to an application network line, and coupled to network interfaces of the servers respectively through the application network line, wherein the servers provide application services through the application network line.

3. The server rack system according to claim 2, wherein the management network line and/or the application network line is an Ethernet line.

4. The server rack system according to claim 1, wherein the identification code signal has at least one flag bit for representing a physical location of the server rack system in a machine room.

5. The server rack system according to claim 1, wherein the rack management module provides a user interface through the management network line, and the user interface provides a display interface for enabling an administrator to read power consumption of the server at each physical location in the rack through the display interface.

6. The server rack system according to claim 1, wherein the rack management module provides a user interface through the management network line, so as to set a power consumption control rule of the server rack system in the rack management module through the user interface.

7. The server rack system according to claim 6, wherein the power consumption control rule comprises:
   setting a power consumption upper limit of the server rack system.

8. The server rack system according to claim 7, wherein the rack management module reads real-time power consumption of internal rack devices other than the servers at a time point, and computes optimal power consumption of the servers at the time point according to the power consumption upper limit, and the rack management module controls real-time power consumption of each of the servers at the time point according to the optimal power consumption.

9. The server rack system according to claim 6, wherein the power consumption control rule comprises:
   when the rack management module determines that at least one server is in a critical state according to the power consumption information of the servers, sending a management instruction to the server to control the server to stop increasing power consumption thereof and/or forbid startup of a server in a standby state.

10. The server rack system according to claim 6, wherein the power consumption control rule comprises:
    when the rack management module determines that at least one server is in a non-recoverable state according to the power consumption information of the servers, controlling the server to shut down forcibly.

11. The server rack system according to claim 1, wherein the rack management module is an intelligent platform management interface (IPMI).

* * * * *